United States Patent [19]

Chinone et al.

[11] Patent Number: 4,780,879
[45] Date of Patent: Oct. 25, 1988

[54] SEMICONDUCTOR LASER DEVICE HAVING LITTLE ASTIGMATISM

[75] Inventors: Naoki Chinone, Hachioji; Shigeo Yamashita, Machida; Shin'ichi Nakatsuka, Kokubunji; Akemi Yamanaka, Kodaira; Yuichi Ono, Tokyo; Toshihiro Kawano, Ome; Kazuhisa Uomi, Hachioji; Takashi Kajimura, Tokyo; Toshiaki Tanaka, Kokubunji; Kunio Aiki, Komoro, all of Japan

[73] Assignee: Hitachi, Ltd., Tokyo, Japan

[21] Appl. No.: 16,410

[22] Filed: Feb. 19, 1987

[30] Foreign Application Priority Data

Mar. 14, 1986 [JP] Japan .................................. 61-54746

[51] Int. Cl.[4] .............................................. H01S 3/19
[52] U.S. Cl. ...................................... 372/46; 372/29; 372/92; 372/108
[58] Field of Search ...................... 372/46, 108, 29, 92, 372/44

[56] References Cited

FOREIGN PATENT DOCUMENTS 0225678 12/1983 Japan .................................. 372/108

OTHER PUBLICATIONS

T. Mamine et al, "Analysis of Astigmatism of Gain Guided Laser with a Tapered Stripe Geometry", J. Appl. Phys. 56(11) 1 Dec. 1984, pp. 3116-3120.
J. Salzman et al, "Unstable Resonator Cavity Semiconductor Lasers", Appl. Phys. Lett. 46(3), 1 Feb. 1985, pp. 218-220.

Primary Examiner—James W. Davie
Attorney, Agent, or Firm—Antonelli, Terry & Wands

[57] ABSTRACT

A semiconductor laser device having a stripe-shaped active region defined between a pair of end surfaces, at least one of the end surfaces having a curved cross-section in a plane parallel to the active region with a radius of curvature from 10 to 300 $\mu$m, the stripe of the active region having such a width that a single transverse mode and a multi-longitudinal mode are allowed. The laser beam emitted from this laser can have little astigmatism and small spot size.

23 Claims, 5 Drawing Sheets

SEMICONDUCTOR LASER DEVICE HAVING LITTLE ASTIGMATISM

BACKGROUND OF THE INVENTION

The present invention relates to a semiconductor laser device, and more particularly to a semiconductor laser device which is suitable for serving as a light source for an optical disk.

A semiconductor laser for an optical disk is required to have a low noise characterisitic. A gain-guided, multi-longitudinal mode laser has such a characteristic (refer to J. Appl. Phys., Vol. 56, 1984, pages 3116 to 3120). In a gain-guided semiconductor laser, however, astigmatism is unavoidable. Thus, it is difficult to focus a laser beam into a small spot. In the semiconductor laser described in the above-referenced publication, the width of a current injection region is varied within a laser crystal, to reduce the astigmatism. However, it is impossible to reduce the astigmatism in a marked degree by the above structure.

Further, a semiconductor laser has been proposed in which an end surface having the form of a curved surface is formed to reduce the astigmasism (refer to Appl. Phys. Lett., Vol. 46, 1985, pages 218 to 220). In this semiconductor laser, however, a stripe-shaped active region has a fairly large width, and hence a far field pattern is not a single lobed pattern. Moreover, a fairly large amount of astigmatism is generaged. This is because, when the stripe-shaped active region is made large in width, it is impossible to control the transverse mode of laser oscillation.

As mentioned above, according to the conventional structures, it is impossible to reduce astigmatism which is generated inevitably in a multi-longitudinal mode laser, to a marked degree and to focus the laser beam into a small spot.

SUMMARY OF THE INVENTION

It is an object of the present invention to provide a semiconductor laser device which has little astigmatism and can generate laser oscillation having a single transverse mode and a multi-longitudinal mode.

In order to attain the above object, according to the present invention, there is provided a semiconductor laser device, in which a stripe-shaped region has such a width as to allow laser oscillation having a single transverse mode, and an end surface of a laser cavity has the form of a curved surface to reduce the astigmatism of the laser device in a marked degree.

In a gain-guided semiconductor laser, in a plane parallel to an active layer, the wave front of the laser beam is not a flat surface perpendicular to the direction of propagation but rather is in the form of a curved surface. Accordingly, a laser beam is emitted from a facet of the semiconductor laser, as if the laser beam had its beam waist within the semiconductor laser. The astigmatism of the semiconductor laser is caused by a fact that a laser beam having a wave front in the form of a curved surface, is emitted from a flat facet of the semiconductor laser. The astigmatism can be reduced by forming a end surface of a laser cavity (that is, a laser crystal) into a curved surface so that the intersection of the end surface and a plane parallel to an active layer has the form of a curved line. Semiconductor lasers having a curved end surface are shown in FIGS. 1 and 2. FIG. 1 is a plan view showing a semiconductor laser which has a convex end surface 1, and FIG. 2 is a plan view showing a semiconductor laser which has a concave end surface 2. Referring to FIGS. 1 and 2, the radius R of curvature of the end surface 1 or 2 is determined in accordance with the shape of the wave front of coherent light within the semiconductor laser so that the wave front of a laser beam emitted from the semiconductor laser has a shape capable of minimizing the astigmatism. The facets shown in FIGS. 1 and 2 have a cross-section of a circular arc. Alternatively, these facets may have a cross-sectional form of parabola, semiellipse or Gaussian curve.

When the end surface of a semi-ellipse laser has the form of a curved surface, the astigmatism of the laser is reduced for the following reason. The amount (or magnitude) of astigmatism is dependent not only upon the spot size of an emited laser beam at the end surface, but also upon the radius of curvature of the wave front of the emitted laser beam at the end surface. In a case where a convex facet is formed as shown in FIG. 1, the spot size at the convex end surface becomes small, but the radius of curvature of the wave front of the emitted laser beam at the convex end surface varies in accordance with the radius of curvature of the convex end surface. In more detail, when the radius of curvature of the convex end surface is increased, the radius of curvature of the wave front of the emitted laser beam first increases to infinity, and then becomes negative. Moreover, the absolute value of negative radius of curvature decreases as the radius of curvature of the convex end surface is made larger. While, in a case where a concave end surface is formed as shown in FIG. 2, the spot size of the emitted laser beam at the end surface becomes large, and the radius of curvature of the wave front of the emitted laser beam decreases as the radius of curvature of the concave end surface is smaller. As mentioned above, the spot size of the emitted laser beam and the shape of the wave front of the emitted laser beam can be varied by forming a laser beam emitting end surface into a curved surface. Accordingly, the form of the end surface is determined so as to reduce the astigmatism. That is, in FIGS. 1 and 2, the amount of astigmatism can be made smaller than that generated when a end surface having the form of a plane is used in place of the curved end surface 1 or 2, by setting the radius R of curvature appropriately.

According to the present invention, a semiconductor laser device can be formed which generates laser oscillation having a single transverse mode and a multi-longitudinal mode and has an astigmatism less than 10 μm. When the semiconductor laser device was operated in a feedback rate less than 5% at a temperature of 0° to 50° C., the relative intensity noise of emitted laser beam was less than $1 \times 10^{-13}$ Hz$^{-1}$ in a frequency range from 200 KHz to 20 MHz.

DESCRIPTION OF THE PREFERRED EMBODIMENTS

EMBODIMENT I

A first embodiment of a semiconductor laser device according to the present invention will be explained with reference to FIG. 3.

Figure 1:
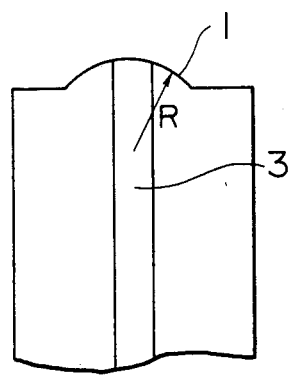
FIGS. 1 and 2 are plan views for explaining the fundamental thought of the present invention.
Figure 2:
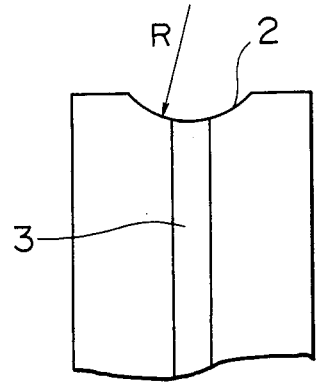
Figure 3:
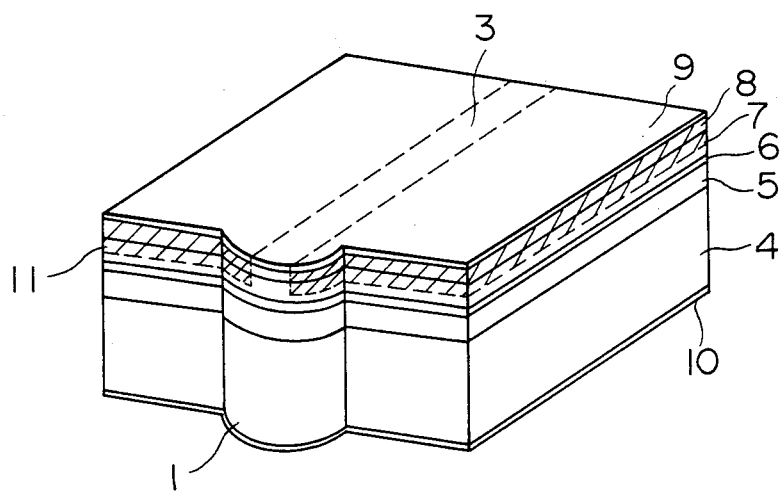
FIGS. 3 and 4 are perspective views showing two embodiments of a semiconductor laser device according to the present invention.

Referring to FIG. 3, an N-type $Ga_{0.5}Al_{0.5}As$ layer 5 which serves as a cladding layer and has a thickness of 2 μm, a $Ga_{0.86}Al_{0.14}As$ layer 6 serving as an active layer and having a thickness of 0.1 μm, a P-type $Ga_{0.5}Al_{0.5}As$ layer 7 serving as another cladding layer and having a thickness of 1.5 μm, and a P-type GaAs layer 8 serving as a cap layer and having a thickness of 1 μm, are successively grown through metal organic chemical vapor deposition techniques, to form a laser crystal on an N-type GaAs substrate 4 having a thickness of 100 μm. Thereafter, proton is implanted into a region 11 of the laser crystal, to define a stripe-shaped current injection region 3. Next, a Cr-Au electrode 9 is deposited on the P-type GaAs cap layer 8, and an AuGeNi-Au electrode 10 is deposited on the N-type GaAs substrate 4. Then, a convex end surface 1 is formed through reactive ion etching techniques, and a desired semiconductor laser is cut out from the above structure. The width of the stripe-shaped region 3 is in a range from 1 to 10 μm, to generate laser oscillation having a single transverse mode. Preferably, the above width is in a range from 3 to 5 μm. Further, the radius of curvature of the end surface 1 is put in a range from 10 to 300 μm, to suppress an increase in threshold current and to reduce the astigmatism. Preferably, the radius of curvature is in a range from 20 to 50 μm. These ranges are determined on the basis of experimental results mentioned later. It was confirmed by experiments that the present embodiment generated laser oscillation having a single transverse mode and a multi-longitudinal mode and has an astigmatism less than 10 μm. That is, the present embodiment has characteristics sufficient for use as the light source for an optical disk.

EMBODIMENT II

Figure 4:
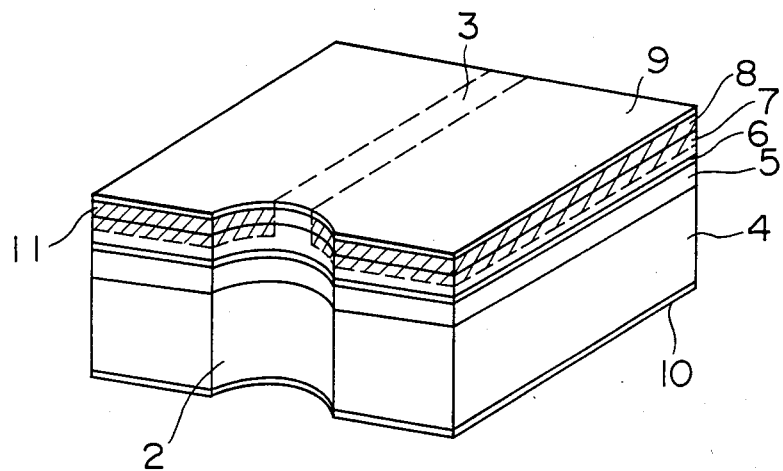

A second embodiment of a semiconductor laser device according to the present invention will be explained, by reference to FIG. 4. Referring to FIG. 4, the present embodiment is fabricated in the same manner as described in the EMBODIMENT I, excepting that a concave end surface 2 is formed through reactive ion etching techniques, in place of the convex end surface 1. In the present embodiment, also, the radius of curvature of the end surface is in a range from 10 to 300 μm, preferably, in a range from 20 to 50 μm.

EMBODIMENT III

Figure 5:
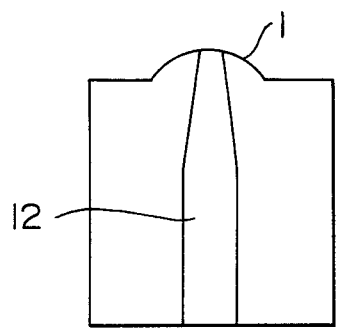
FIGS. 5 to 11 are plan views showing other embodiments of a semiconductor laser device according to the present invention.
Figure 6:
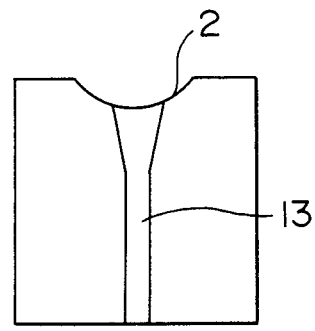

In the first and second embodiments, the width of the stripe-shaped current injection region is kept constant throughout the laser cavity. However, the threshold current for generating laser oscillation and the astigmatism can be further reduced by varying the width of the stripe-shaped region at a portion in the neighborhood of the end surface, in accordance with the form of the end surface. Two embodiments having such a structure are shown in FIGS. 5 and 6. FIG. 5 shows a case where a convex end surface 1 having a radius of curvature of about 20 μm is formed, and the width of a stripe-shaped current injection region 12 is reduced to 2 μm at the convex end surface 1 and made equal to 8 μm at the opposite end surface. In other words, the width of an injection region converges toward a convex end. While, FIG. 6 shows a case where a concave end surface 2 having a radius of curvature of about 20 μm is formed, and the width of a stripe-shaped current injection region 13 is increased to 8 μm at the concave end surface 2 and made equal to 2 μm at the opposite end surface. In other words, the width of an injection region diverges toward a concave end. In either case, a semiconductor laser can be realized which generates laser oscillation having a multilongitudinal mode and has an astigmatism less than 10 μm. Values of the stripe width at the end surface 1 or 2 and the opposite facet are not limited to the above-mentioned ones, but may be varied in accordance with the radius of curvature of the end surface 1 or 2.

EMBODIMENT IV

Figure 7:
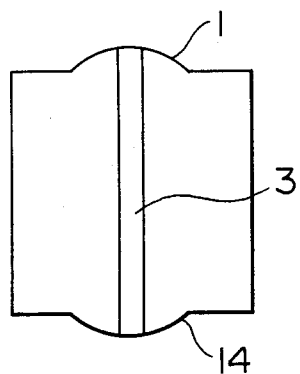
Figure 8:
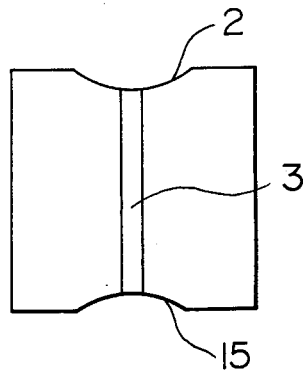
Figure 9:
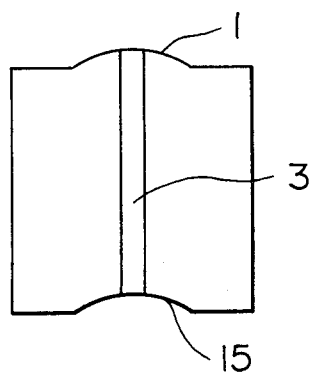

In the embodiments which have been explained in the EMBODIMENTS I to III, one of a pair of end surfaces has the form of a curved surface. However, each of a pair of end surfaces may be formed into a curved surface. FIG. 7 shows a case where convex end surfaces 1 and 14 are formed at both ends of a semiconductor crystal, FIG. 8 shows a case where concave end surfaces 2 and 15 are formed at both ends of a semiconductor crystal, and FIG. 9 shows a case where a convex end surface 1 and a concave facet 15 are formed at opposite ends of a semiconductor crystal. In these cases, the characteristics of semiconductor laser can be further improved by setting the radius of curvature of each of a pair of curved facets appropriately. In each of the embodiments shown in FIGS. 7 to 9, the width of a stripe-shaped current injection region 3 may be varied in the neighborhood of the curved end surfaces.

EMBODIMENT V

Figure 10:
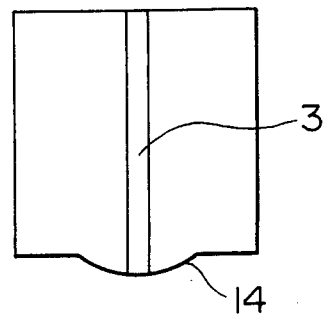
Figure 11:
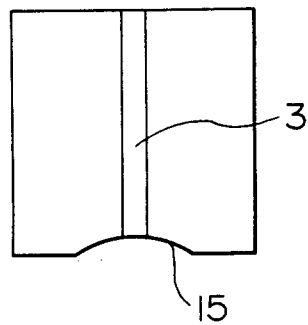

In the embodiments which have been explained in the EMBODIMENTS I to IV, a laser beam is emitted from a curved end surface. When one of a pair of end surfaces is formed into a curved surface, the light distribution in a laser crystal is varied, and hence the wave front of a laser beam emitted from a flat plane end surface opposite to a curved end surface is also varied. The astigmatism can be reduced by using a laser beam emitted from the above-mentioned flat plane end surface. FIGS. 10 and 11 show embodiments having the above structure. FIG. 10 shows a case where a laser beam is emitted from a plane end surface opposite to a convex facet 14, and FIG. 11 shows a case where a laser beam is emitted from a plane end surface opposite to a concave facet 15. In either case, the width of a stripe-shaped current injection region 3 may be varied in the vicinity of the curved end surface 14 or 15.

EMBODIMENT VI

Many semiconductor laser devices were fabricated in the same manner as described in the EMBODIMENT I, except that proton implantation was carried out by a micro ion implantation apparatus to put the width of a stripe-shaped current injection region in a range from 30 Å to 2 μm.

In the embodiments which have been explained in the EMBODIMENTS I to V, a cross section of a curved end surface parallel to an active layer has the form of a circular arc. However, the cross section may have the form of a parabola, semiellipse, or Gaussian curve, or may be formed by a combination of a curved line and a straight line, or a combination of a plurality of straight lines. Further, a semiconductor laser made of GaAlAs and GaAs has been explained by way of example. The semiconductor laser may be made of other compound semiconductor materials, for example, InGaAsP and InP, or InGaAlP and GaAs.

EMBODIMENT VII

Figure 12:
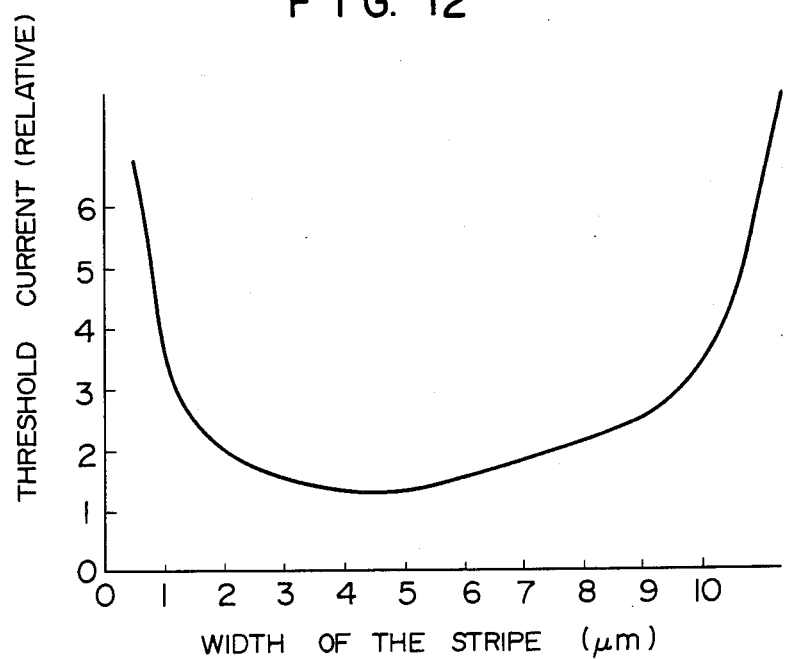
FIG. 12 is a graph showing a relation between the width of stripe-shaped region and the threshold current for generating laser oscillation.
Figures 13, 14:
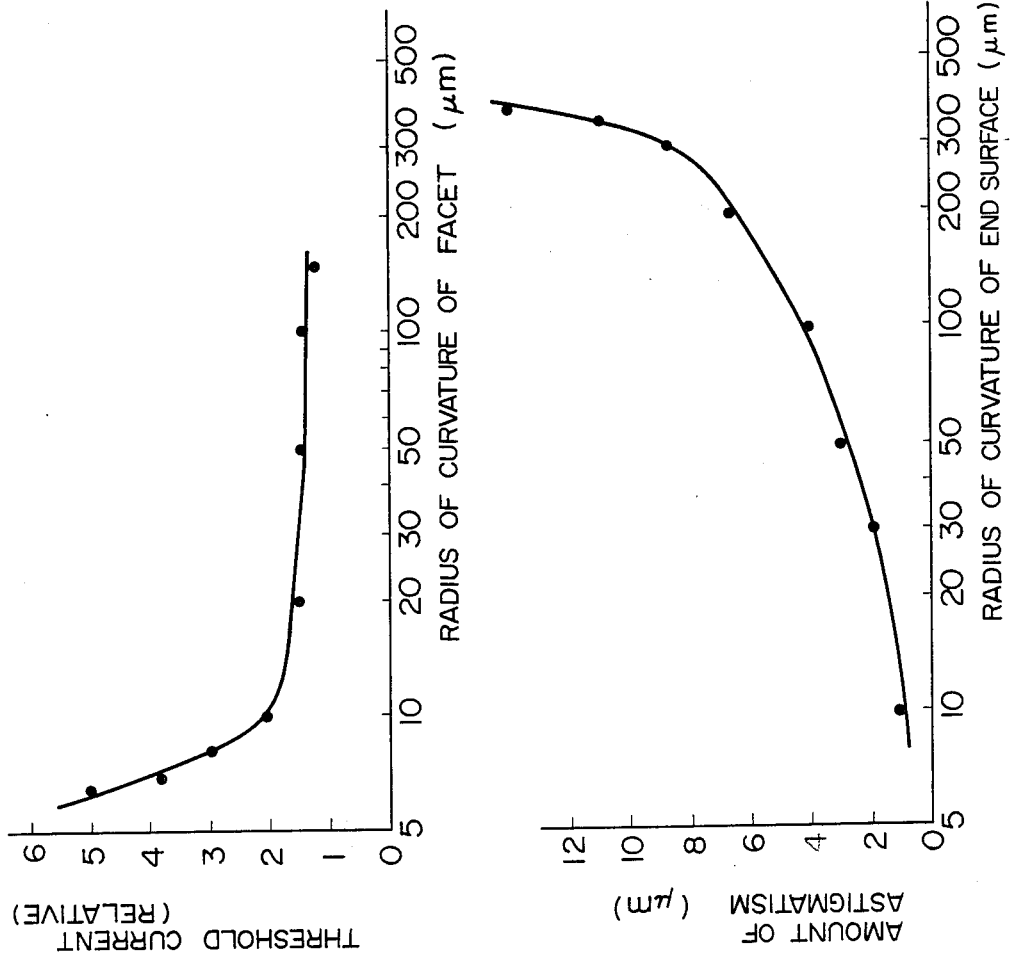
FIG. 13 is a graph showing a relation between the radius of curvature of end surface and the threshold current.
FIG. 14 is a graph showing a relation between the radius of curvature of end surface and the amount of astigmatism.

A multiplicity of semiconductor laser devices having structures which have been explained in the EMBODIMENTS I to VI, were fabricated to study the stripe-width dependence of threshold current, and a relation between the radius of curvature of end surface and the threshold current or astigmatism. FIG. 12 shows a relation between the width of stripe-shaped current injection region and the threshold current, FIG. 13 shows a relation between the radius of curvature of end surface and the threshold current, and FIG. 14 shows a relation between the radius of curvature of end surface and the amount of astigmatism. As is apparent from FIG. 12, when the width of stripe-shaped current injection region is made less than 1 $\mu$m or greater than 10 $\mu$m, the threshold current increases abruptly. When the width of stripe-shaped region is put in a range from 3 to 5 $\mu$m, the threshold current has a small value. Further, as is apparent from FIGS. 13 and 14, when the radius of curvature of end surface is made less than 10 $\mu$m, the threshold current increases abruptly. When the radius of curvature of end surface is made greater than 300 $\mu$m, the amount of astigmatism increases abruptly, and becomes greater than 10 $\mu$m. When the radius of curvature of end surface is in a range from 20 to 50 $\mu$m, the threshold current has a small value, and moreover the amount of astigmatism is small.

What is claimed is:

1. A semiconductor laser device having little astigmatism comprising: a semiconductor substrate; semiconductor layers formed on said semiconductor substrate, including a first clad semiconductor layer, having a first band gap, a second clad semiconductor layer, having a second band gap, and an active semiconductor layer for generating layer oscillation formed between said first and second clad semiconductor layers, and having a third band gap less than said first and second band gaps; a stripe-shaped region formed in at least a portion of the semiconductor layers to define a laser cavity between a pair of semiconductor end surfaces, wherein at least one of the semiconductor end surfaces is so curved that the intersection of said one semiconductor end surface and a plane parallel to the active semiconductor layer has the form of a curved line, and the width of the stripe-shaped region in a direction perpendicular to a laser beam traveling direction and parallel to the active layer lies within a range from 1 to 10 $\mu$m; and a pair of electrodes for injecting current to said stripe-shaped region.

2. A semiconductor laser device according to claim 1, wherein said curved line is a circular arc, and the radius of curvature thereof lies in a range from 10 to 300 $\mu$m.

3. A semiconductor laser device according to claim 1, wherein said width of the stripe-shaped region lies within a range from 3 to 5 $\mu$m.

4. A semiconductor laser device according to claim 1, wherein the semiconductor substrate and the semiconductor layers are made of compound semiconductor materials.

5. A semiconductor laser device according to claim 1, wherein said curved line is a parabola.

6. A semiconductor laser device according to claim 1, wherein said curved line is a circular arc, and the radius of curvature lies in a range from 10 to 300 $\mu$m.

7. A semiconductor laser device according to claim 6, wherein said curved line is a circular arc, and the radius of curvature thereof lies in a range from 20 to 50 $\mu$m.

8. A semiconductor laser device according to claim 1, wherein said curved semiconductor end surface has a convex shape.

9. A semiconductor laser device according to claim 1, wherein said curved semiconductor end surface has a concave shape.

10. A semiconductor laser device according to claim 8, wherein the width of said stripe-shaped region is smaller at said curved semiconductor end surface than at the other of said pair of semiconductor end surfaces.

11. A semiconductor laser device according to claim 9, wherein the width of said stripe-shaped region is greater at said curved semiconductor end surface than at the other of said pair of semiconductor end surfaces.

12. A semiconductor laser device according to claim 1, wherein the other of said pair of semiconductor end surfaces is so curved that the intersection of said other semiconductor end surface and a plane parallel to the active semiconductor layer has the form of a curved line.

13. A semiconductor laser device according to claim 12, wherein said one semiconductor end surface has a convex shape.

14. A semiconductor laser device according to claim 13, wherein said other semiconductor end surface has a convex shape.

15. A semiconductor laser device according to claim 13, wherein said other semiconductor end surface has a concave shape.

16. A semiconductor laser device according to claim 12, wherein said one semiconductor end surface has a concave shape.

17. A semiconductor laser device according to claim 16, wherein said other semiconductor end surface has a concave shape.

18. A semiconductor laser device according to claim 12, wherein the width of said stripe-shaped region varies along its length.

19. A semiconductor laser device according to claim 1, wherein a laser beam is emitted from said curved semiconductor end surface.

20. A semiconductor laser device according to claim 1, wherein a laser beam is emitted from the other of said pair of semiconductor end surfaces.

21. A semiconductor laser device according to claim 1, wherein said curved line is a semi-ellipse.

22. A semiconductor laser device according to claim 1, wherein said curved line is a Gaussian curve.

23. A semiconductor laser device comprising:
a semiconductor substrate;
semiconductor layers formed on said semiconductor substrate, including a first clad semiconductor layer, having a first band gap, a second clad semiconductor layer, having a second band gap, and an active semiconductor layer for generating layer oscillation formed between said first and second clad semiconductor layers, and having a third band gap less than said first and second band gaps;

a stripe-shaped region formed in at least a portion of the semiconductor layers to define a laser cavity between a pair of semiconductor end surfaces, wherein at least one of the semiconductor end surfaces is so curved that the intersection of said one semiconductor end surface and a plane parallel to the active semiconductor layer has the form of a curved line, and the width of the stripe-shaped region in a direction perpendicular to a laser beam traveling direction and parallel to the active layer lies within a range from 1 to 10 $\mu$m, so as to enable generation of laser oscillation having a single transverse mode and a multi-longitudinal mode with little astigmatism; and a pair of electrodes for injecting current to said stripe-shaped region.

* * * * *